United States Patent [19]
Vittoria et al.

[11] Patent Number: 5,420,100
[45] Date of Patent: May 30, 1995

[54] PLANAR SQUID MAGNETOMETER WITH INDUCTIVELY COUPLED MICROSTRIP RESONATOR

[75] Inventors: Carmine Vittoria, Newton; Allan Widom, Brookline; Yizhou Huang, Cambridge; Hoton How, Malden, all of Mass.

[73] Assignee: Northeastern University, Boston, Mass.

[21] Appl. No.: 682,104

[22] Filed: Apr. 5, 1991

[51] Int. Cl.[6] .................... G01R 33/035; H01L 39/22; H01P 7/00
[52] U.S. Cl. ...................... 505/162; 257/33; 257/34; 324/248; 324/250; 324/637; 333/99 S; 505/846; 327/510; 327/528
[58] Field of Search ............ 324/248, 250, 637, 642; 307/306; 333/219, 219.2, 99 S, 246; 357/5, 27, 31–34, 421; 505/702, 846, 162

[56] References Cited

U.S. PATENT DOCUMENTS

| | | | |
|---|---|---|---|
| 4,320,341 | 3/1982 | Lutes | 324/248 |
| 4,468,635 | 8/1984 | Lukens et al. | 307/306 X |
| 4,470,023 | 9/1984 | Lukens et al. | 307/306 X |
| 4,491,795 | 1/1985 | Gelinas | 324/248 |
| 4,496,854 | 1/1985 | Chi et al. | 307/306 |
| 4,585,999 | 4/1986 | Hilbert et al. | 324/248 |
| 4,631,493 | 12/1986 | Vendelin et al. | |
| 4,687,987 | 8/1987 | Kuchnir et al. | 324/71.3 |
| 4,814,728 | 3/1989 | Strayer et al. | |
| 4,869,598 | 9/1989 | McDonald | 307/306 X |
| 5,065,096 | 11/1991 | Mück et al. | 324/248 |
| 5,142,229 | 8/1992 | Marsden | 324/248 |

OTHER PUBLICATIONS

L. C. Shen, "The Eliptical Microstrip Antenna with Circular Polarization", IEEE Transactions on Antennas and Propagation, vol. AP-29, No. 1, Jan., 1981, pp. 90–94.
Clarke, John; Advances in SQUID Magnetometers, IEEE Transactions on Electron Devices, vol. ED-27, No. 10, Oct. 1980, pp. 1896–1908.
DiNardo et al; Superconducting Microstrip High-Q Microwave Resonators Journal of Applied Physics vol. 42, No. 1, Jan. 1971, pp. 186–189.
Huang et al; Observation of X-band SQUID Signals in a High-$T_c$ Superconducting Film Device, Journal of Superconductivity, vol. 3, No. 4, 1990 pp. 441–446.
Koch et al; Low-Noise Thin-Film TIBaCaCuO dc SQUIDS Operated at 77K Appl. Phys. Lett. 54(10), 6 Mar. 1989 pp. 951–953.
Long et al; Varactor Tuned Ultrahigh Frequency SQUID Magnetometer, Rev. Sci. Instrum. 51(1), Jan. 1980 pp. 8–13.
Prance et al; Charge Band Behaviour in a Superconducting Weak Link Driven by a Normal Faraday Law Voltage Source, Physics Letters vol. 111A, No. 4, 9 Sep. 1985 pp. 199–204.
Prance et al; "Noise, Bandwith . . . of an AC Biased SQUID Magnetometer" PProc. IC SQUID Conf. Berlin, Jun. 1985 (de Gruyter, Berlin, 1985, pp. 151–156.
Widom et al, Quantum Electrodynamic Uncertainty Relations Physics Letters vol. 90A, No. 6, 19 Jul. 1982 p. 280.
Zimmerman, James E; SQUID Instruments and Shielding for Low-Level Magnetic Measurements, Journal of Applied Physics, vol. 48, No. 2, Feb. 1977 pp. 702–710.

*Primary Examiner*—Gerard R. Strecker
*Attorney, Agent, or Firm*—Weingarten, Schurgin, Gagnebin & Hayes

[57] ABSTRACT

A planar SQUID magnetometer for detection and measurement of an applied magnetic flux is disclosed wherein a planar microwave-resonant element overlaps a Josephson device incorporated in a high-$T_c$ superconducting, thin-film SQUID device, thereby providing inductive coupling between the planar microwave-resonant element and the SQUID device. When the microwave-resonant element is excited by incident high-frequency microwave radiation, the intensity of reflected microwave radiation varies in response to a magnetic flux applied to the SQUID device in accordance with non-linear oscillatory behavior of the microwave-resonant element due to inductive loading by the SQUID device. The microwave-resonant element and the SQUID device are preferably fabricated photolithographically on a single substrate.

22 Claims, 7 Drawing Sheets

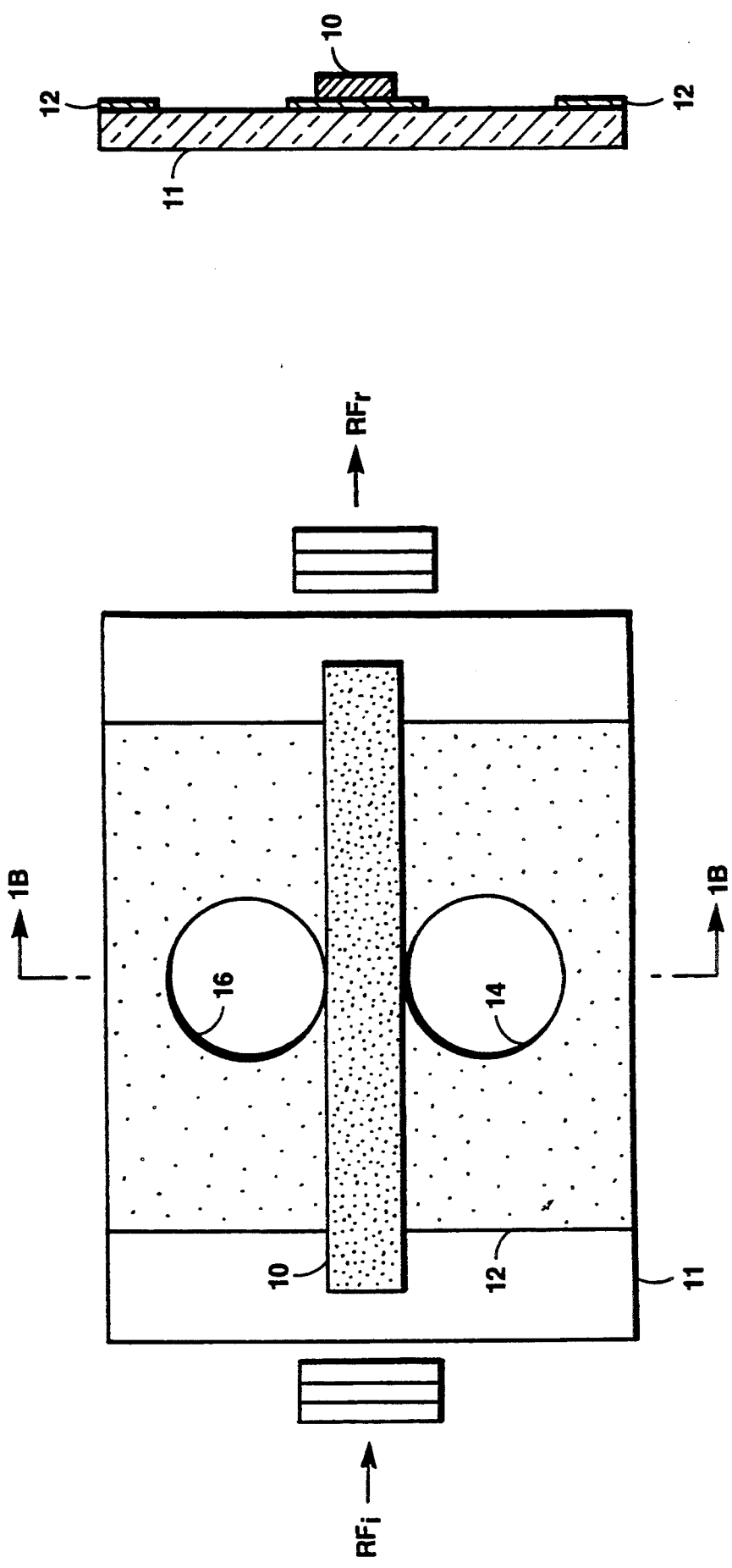

PLANAR SQUID MAGNETOMETER WITH INDUCTIVELY COUPLED MICROSTRIP RESONATOR

GOVERNMENT RIGHTS

This invention was made with Government support under Grant 9011618 awarded by the National Science Foundation. The Government has certain rights in this invention.

FIELD OF THE INVENTION

This invention relates to RF SQUID magnetometers, and particularly to planar RF SQUID magnetometers for use with high-frequency microwave radiation.

BACKGROUND OF THE INVENTION

Superconducting quantum interference device (SQUID) magnetometers are known for measurement of magnetic fields in both the DC and radio frequency (RF) regimes. See, for example, J. Zimmerman et al., *Appl. Phys. Lett.*, 51, p. 617 (1987).

An RF SQUID consists of a single non-hysteretic Josephson device, such as a Josephson junction, a weak link, or a point contact junction, wherein the Josephson device interrupts a superconducting current. An RF SQUID acts as a two-terminal element with a non-linear current-voltage relationship. The exact current-voltage relationship is determined by the strength of a magnetic flux intercepted by the SQUID. This magnetic flux dependence can be used as a basis for a variety of measurement devices, such as volt meters, ammeters, gradiometers, microwave phase shifters, filters, mixers, microwave detectors and magnetometers.

For example, voltage fluctuations in a current-biased, unshielded SQUID provide an indication of changes in a local applied magnetic field. Typically, an LC-resonant circuit, such as an oscillator tank circuit, is placed near the SQUID so that an RF signal may be introduced. The magnetic field generated by the LC-resonant resonant circuit inductively couples to the SQUID, influencing the voltage across it. In particular, the inductive coupling detunes the LC-resonant circuit from its natural resonating frequency. The extent of coupling between the LC-resonant circuit and the SQUID is frequency dependent. Consequently, the loading of the LC-resonant circuit due to coupling is also frequency dependent. Additionally, the loading of the resonant circuit depends on the internal differential inductance of the SQUID device, which varies periodically with an applied magnetic flux. The result is a system with an output response amplitude that varies non-linearly with its input driving amplitude, and in accordance with an applied magnetic flux. Thus, reflected microwave power varies in accordance with a magnetic flux applied to the SQUID device due to non-linear behavior of the LC-resonant circuit, thereby allowing detection and measurement of the local magnetic flux. When a quasistatic magnetic flux that is intercepted by the SQUID is changed, the voltage amplitude measured across the resonant circuit oscillates. The voltage across the resonant circuit is then detected and amplified.

One advantage of a higher frequency magnetometer device lies in the broader bandwidth that would be available for the detection of dynamic magnetic field signals. However, known RF SQUIDs can inductively couple only to signals with frequencies of less than 430 MHz, and cannot couple to high frequency RF signals that exceed 1000 MHz, while maintaining high sensitivity.

SUMMARY OF THE INVENTION

A planar SQUID magnetometer for detection and measurement of an applied magnetic flux is disclosed wherein a planar microwave-resonant element overlaps a Josephson device incorporated in a high-$T_c$ superconducting, thin-film SQUID device, thereby providing inductive coupling between the planar microwave-resonant element and the SQUID device. The SQUID device can be either a balanced two-hole or an unbalanced single-hole device. When the resonant element is excited by incident high-frequency microwave radiation, the intensity of reflected microwave radiation varies in response to a DC magnetic flux applied to the SQUID device in accordance with non-linear oscillatory behavior of the resonant element due to inductive loading by the SQUID device. The resonant element and the SQUID device are preferably fabricated photolithographically on a single substrate.

In a preferred embodiment, a microstrip resonator overlaps a microbridge weak link of the SQUID device, and is thereby in sufficiently close proximity to the SQUID to be inductively coupled. Inductive loading introduced by the inductively coupled SQUID device detunes the microstrip resonator from its natural resonating frequency. Since the extent of coupling between the resonant strip and the SQUID is frequency dependent, the loading of the resonant strip due to coupling is also frequency dependent. Additionally, the loading of the microstrip resonator depends on the internal differential inductance of the SQUID device, which varies periodically with an applied magnetic flux. Thus, the resonant strip/SQUID system has an output response amplitude that varies non-linearly with its input driving amplitude. Microwave power reflected from the system varies in accordance with a DC magnetic flux applied to the SQUID device due the to non-linear behavior of the microstrip resonator, thereby allowing detection and measurement of the DC magnetic flux, as well as transient magnetic flux.

The cut-off frequency of the microstrip resonator of the preferred embodiment is approximately 53 GHz, for example. Consequently, the planar SQUID magnetometer of the invention can inductively couple to signals with frequencies greater than 430 MHz, including high frequency microwave signals that exceed 50 GHz, while providing high sensitivity. Furthermore, the use of high frequency signals provides a bandwidth of sufficient breadth for detection of dynamic magnetic field signals.

DESCRIPTION OF THE DRAWING

The invention will be more fully understood from the following detailed description, in conjunction with the accompanying figures, in which:

FIG. 1A is a top view of an embodiment of the planar SQUID magnetometer of the invention;

FIG. 1B is a cross sectional view taken along lines 1B—1B of the magnetometer of FIG. 1A;

DESCRIPTION OF THE PREFERRED EMBODIMENT

Figure 2A:
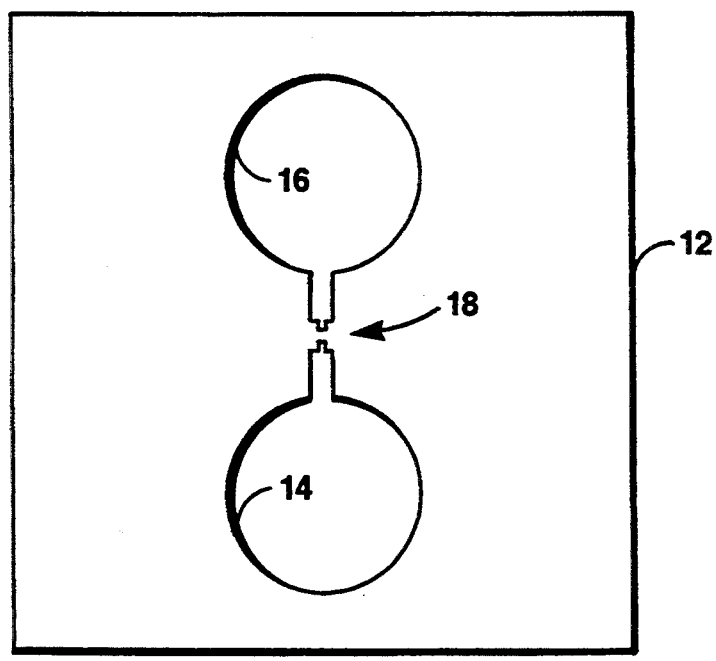
FIG. 2A is a top view of a two-hole SQUID device.
Figure 2B:
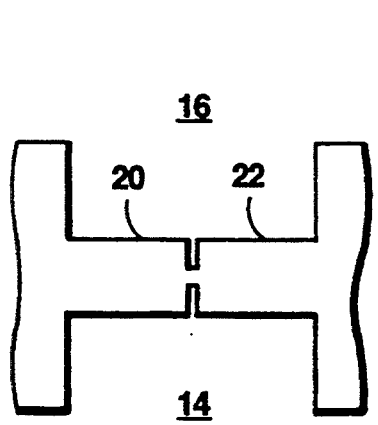
FIG. 2B is a magnified view of the bridge region of the two hole SQUID device of FIG. 2A.
Figure 2C:
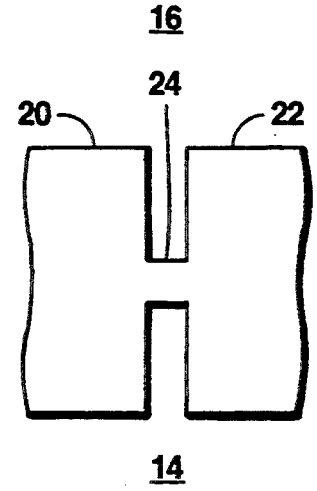
FIG. 2C is a further magnified view of the bridge region of FIG. 2B, showing a microbridge.
Figure 2D:
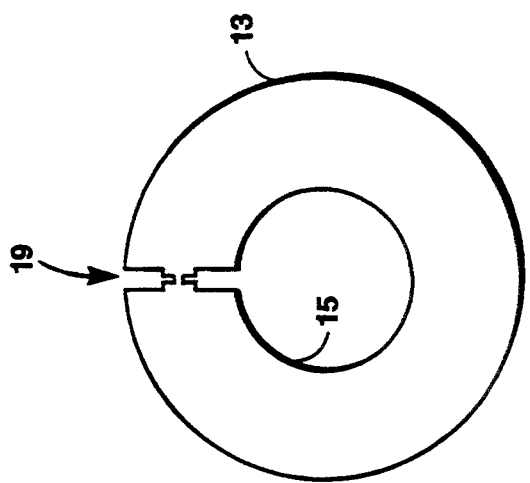
FIG. 2D is a top view of a single-hole SQUID device.

With reference to FIGS. 1A and 2A, a microstrip resonator 10 is disposed on a substrate 11 and in contact with a two-hole SQUID 12. The resonator 10 overlies a bridge region 18 of the two-hole SQUID 12, and rests between the two holes 14 and 16. The bridge region 18, obscured by the resonator 10 in FIG. 1A, is shown in FIG. 2A, with a further magnified view of the region 18 shown in FIG. 2B, and a yet further magnified view showing the microbridge 24 provided in FIG. 2C. A left bridge strip 20, a right bridge strip 22, and the microbridge 24 serve as a portion of the boundary of the two holes 14 and 16 of the SQUID 12. FIG. 2D shows an unbalanced single-hole SQUID device 13 with a hole 15 and a bridge region 19 which is structurally identical to the bridge region 18 of the two-hole SQUID device 12.

Exemplary dimensions of the two-hole SQUID are as follows: each hole 14, 16 is 0.06 inches in diameter, each bridge strip 20, 22 is 20 to 30 micrometers in width and approximately 50 micrometers in length, and the microbridge 24 is 1 micrometer in width, 1 micrometer in length, and 1 micrometer in thickness.

The microstrip resonator 10 is coupled inductively to the two-hole SQUID 12. Consequently, the resonator 10 is detuned from its natural resonating frequency due to inductive loading, resulting in a non-linear response amplitude when the resonator 10 is excited by an input driving amplitude. Furthermore, the inductive loading depends critically on the difference in inductance between the SQUID 12 and the resonator 10, and this difference in inductance is a periodic function of an applied magnetic flux intercepted by the SQUID. Thus, the non-linear response amplitude is an indication of the presence and extent of an applied magnetic flux. This effect is employed to provide magnetometer functionality.

In use, an incident beam of microwave radiation $RF_i$ impinges on the microstrip resonator 10. The microwave radiation is absorbed and then reradiated as a reflected beam $RF_r$ and a transmitted wave (not shown). The microstrip resonator 10 functions as an LC-resonant element responsive to microwave frequencies 'f' that are given by the equation: $f=(v/2l)n$, where $n=1,2,3,\ldots$, l is the length of the microstrip resonator, and v is the phase velocity, where $v \approx c/\epsilon^{0.5}$ and $\epsilon$ is the dielectric constant of the resonator and c is the speed of light in a vacuum. The resonator 10 can resonate with more than one frequency. For $l=1$ centimeter (cm), and $\epsilon=9$, the resonant modes occur at 5, 10, 15, 20, ... GHz. When fabricated from copper, the loaded Q of the microstrip resonator 10 is approximately 200 to 300. Alternatively, niobium resonators provide a Q from 200,000 to 500,000. In a preferred embodiment, the microstrip resonator 10 is superconducting. In general, a resonator strip of a higher Q will provide higher sensitivity.

In the fundamental mode of resonance, i.e., for $n=1$, the center of the microstrip resonator 10 exhibits maximum magnetic field strength, and minimum electric field strength. The SQUID 12 is disposed near the center of the microstrip resonator 10 so as to encounter maximum magnetic field strength and thereby maximize coupling by magnetic field induction.

To illustrate the operation of the planar SQUID magnetometer, it is useful to show how the magnetometer responds to a range of frequencies of microwave radiation, and to microwave signals of a range of input power. Non-linearities in the response of the magnetometer to these various input signals substantiate the presence of mutual inductive coupling between the resonator 10 and the SQUID 12. Additionally, plots of normalized voltage provided by a lock-in amplifier versus applied magnetic flux indicate correct operation of the invention.

Figure 3:
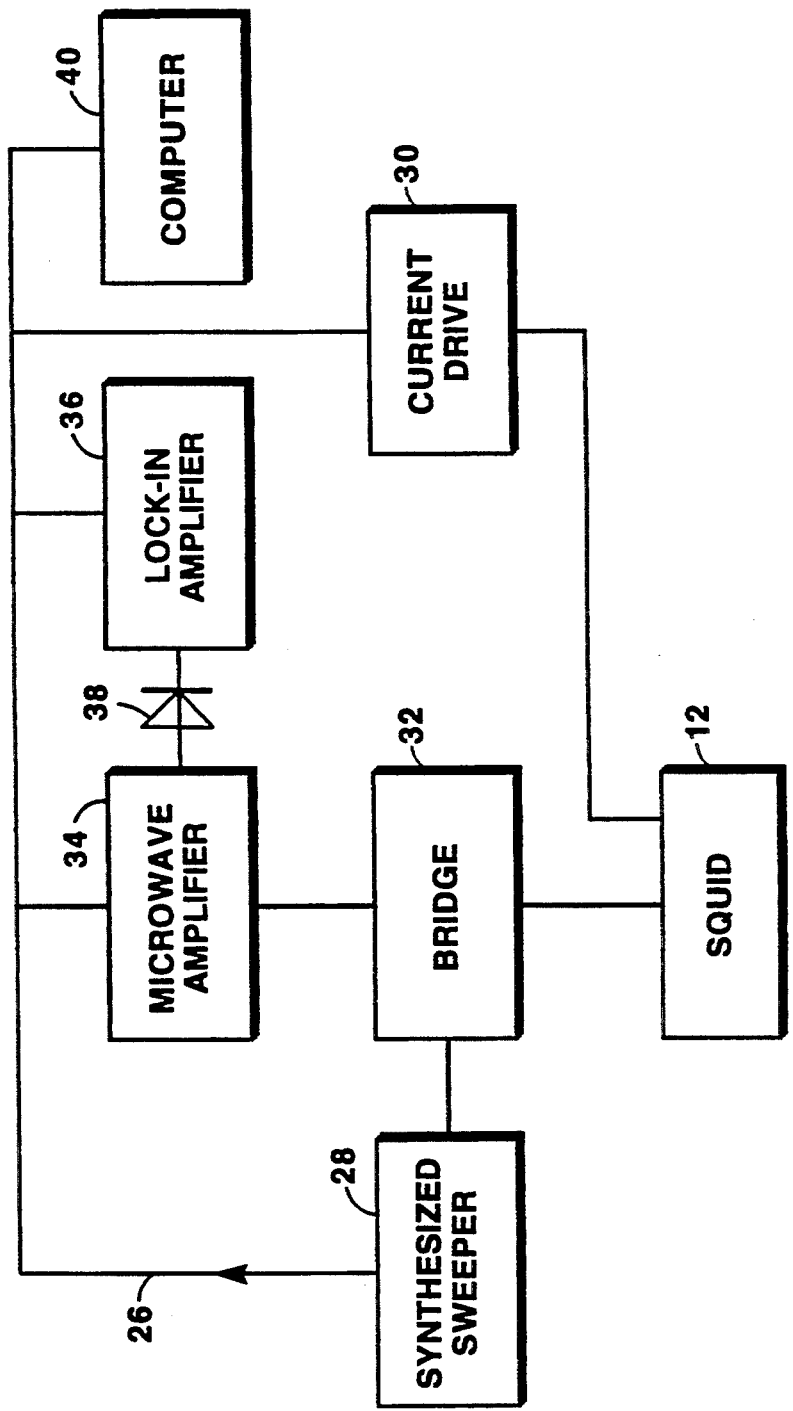
FIG. 3 is a block diagram of electronics for use with the invention.

Referring to FIG. 3, input signals 26 are generated by a synthesized sweeper 28, such as the HP8341 synthesized sweeper. The minimum output power that can be generated by the synthesized sweeper is $-110$ dbm, corresponding to $10^{-14}$ watts. The smallest change in the input power can be $10^{-16}$ watts. A current drive 30 includes a WAVETEK function generator yielding a 2 Hz triangular current source wave form, and a current drive wire that provides an external magnetic flux to the resonator/SQUID system. The current drive wire is placed near one of the holes in the SQUID. One flux quantum $\phi_0 = h/2e$ of applied flux, where h is Plank's constant and e is the charge of the electron, corresponds to approximately 10 microamps of current through the current drive wire. A bridge 32 (or directional coupler) serves to separate the reflected signal from the incident signal applied to the resonator/SQUID system. A microwave amplifier 34 receives a signal from the bridge 32, the amplifier 34 having a bandwidth extending from 7 to 17 GHz, a frequency range appropriate to the measurement of the 9.52 and 14.12 GHz resonant frequencies 46 and 48 of FIG. 6, discussed below. The input microwave signal is amplitude modulated at 27.8 kHz so that a lock-in amplifier 36, such as the EG&G 5208, can sense the modulation via a crystal diode detector 38. In this manner, the envelope of the microwave signal was measured as a function of the input current drive. The lock-in detection was performed at both the fundamental and second harmonic frequencies. Data acquisition and processing are controlled by a personal computer 40, such as an HP9000/300.

Figure 4:
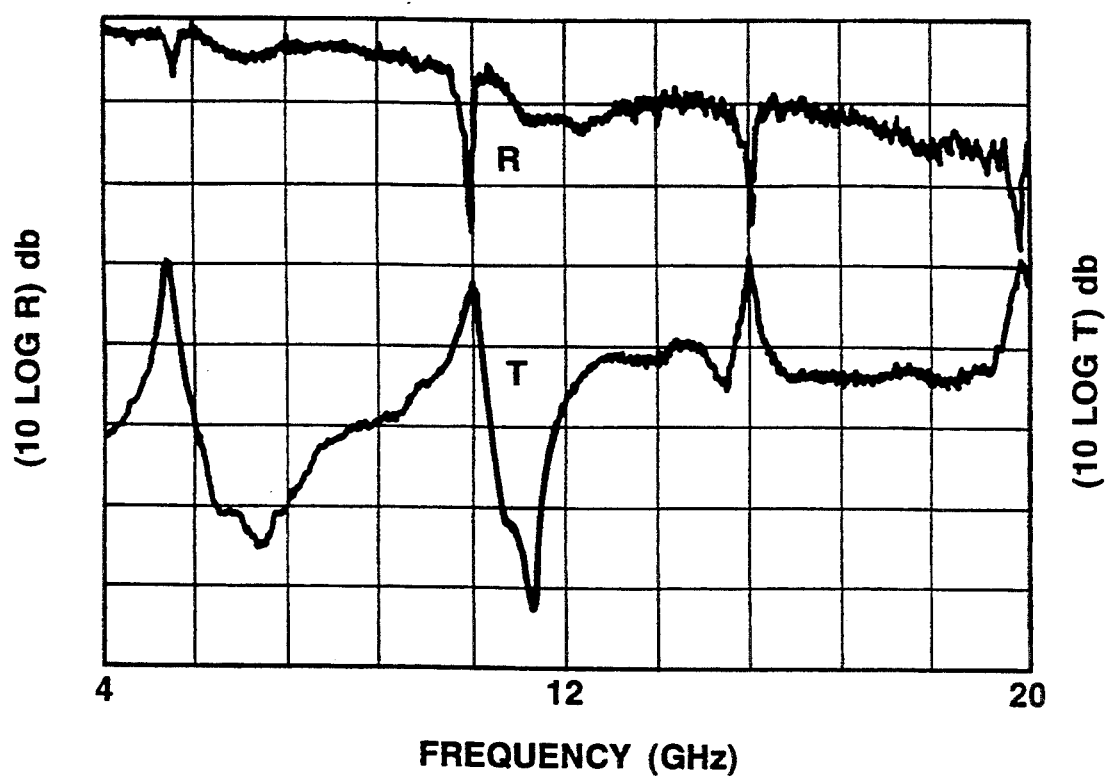
FIG. 4 is a plot of the magnitudes of reflected and transmitted microwave signals versus frequency illustrating the behavior of the microstrip resonator uncoupled to the SQUID device.

At room temperature, and with the microstrip resonator 10 uncoupled to the SQUID 12, the magnitudes of the reflected signals $R = S_{11}(\omega)$ and transmitted signals $T = S_{12}(\omega)$ were measured. The results of these measurements are given in FIG. 4, wherein (10logR) db and (10logT) db are plotted as a function of frequency in gigahertz.

The amplitudes R and T of reflection and transmission for a microstrip resonator are described by the elastic single microwave photon scattering matrix elements, respectively denoted by $S_{11}(\omega)$ and $S_{12}(\omega)$. When the resonator 10 behaves linearly, this conventional description of microwave transmitted and reflected amplitudes is entirely correct. However, SQUID operation depends entirely on non-linear responses, and consequently, multi-microwave photon processes have to be considered in more detail; i.e., the conventional single photon scattering matrix model is not complete. Nevertheless, the magnitudes of reflection R and transmission T still sufficiently behave as a function of frequency and input power to provide evidence of correct device operation, even in the non-linear regime.

Figure 5:
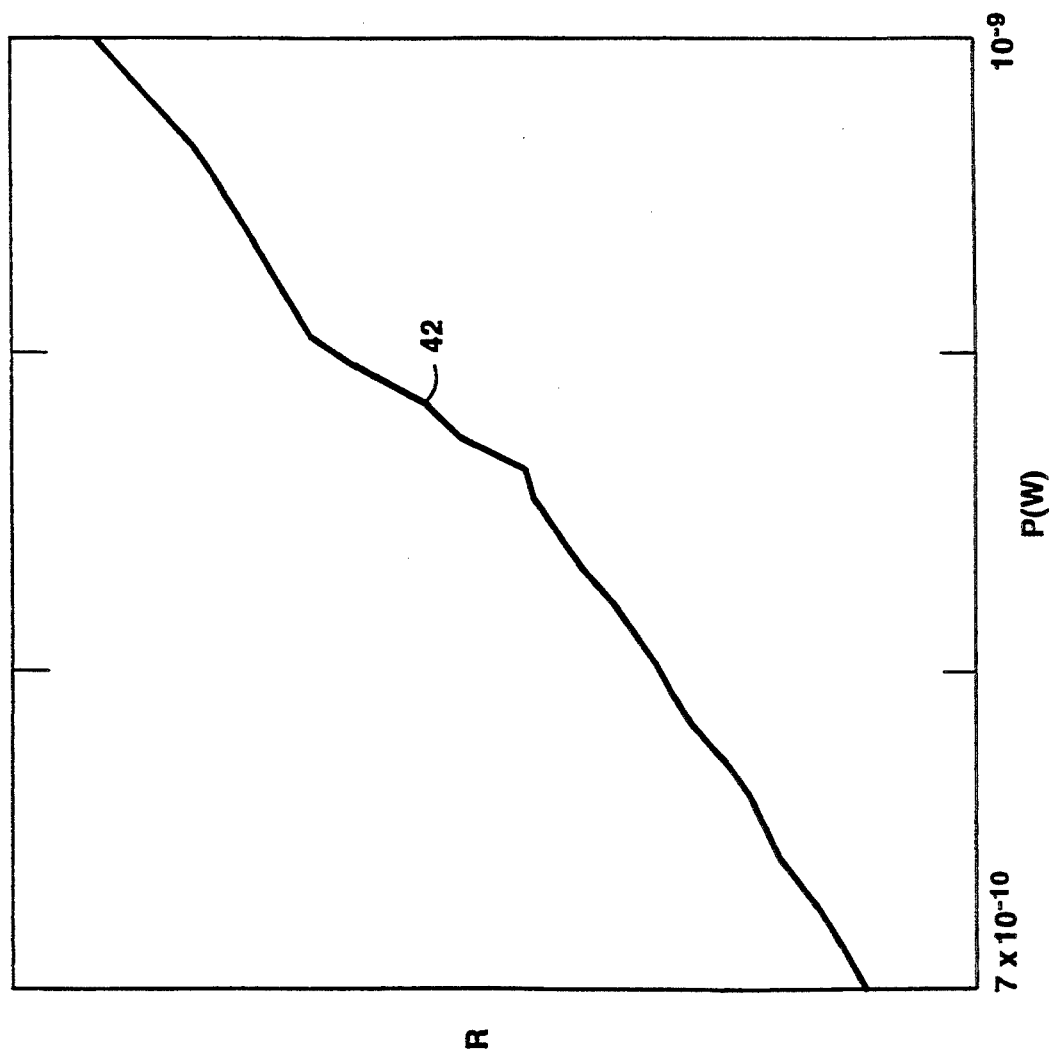
FIG. 5 is a plot of the reflected microwave signal amplitude versus input power illustrating an input power regime of the resonator/SQUID system with useful non-linearity.

With reference to FIG. 5, in the absence of an external applied DC magnetic flux, the microstrip resonator is excited by a plurality of input signals that span a range of input power from $7 \times 10^{-10}$ to $10^{-9}$ watts. The resulting magnitude of reflection R is plotted as a function of input power. At approximately $9 \times 10^{-10}$ watts there is a strong non-linearity 42 in the system. This non-linearity provides an empirical indication, for this particular resonator, and at a temperature of 5° K., of the optimum input power with which to bias the system in order to optimally detect periodic variations in R when a DC magnetic flux is applied to the coupled resonator/SQUID system.

Figure 6:
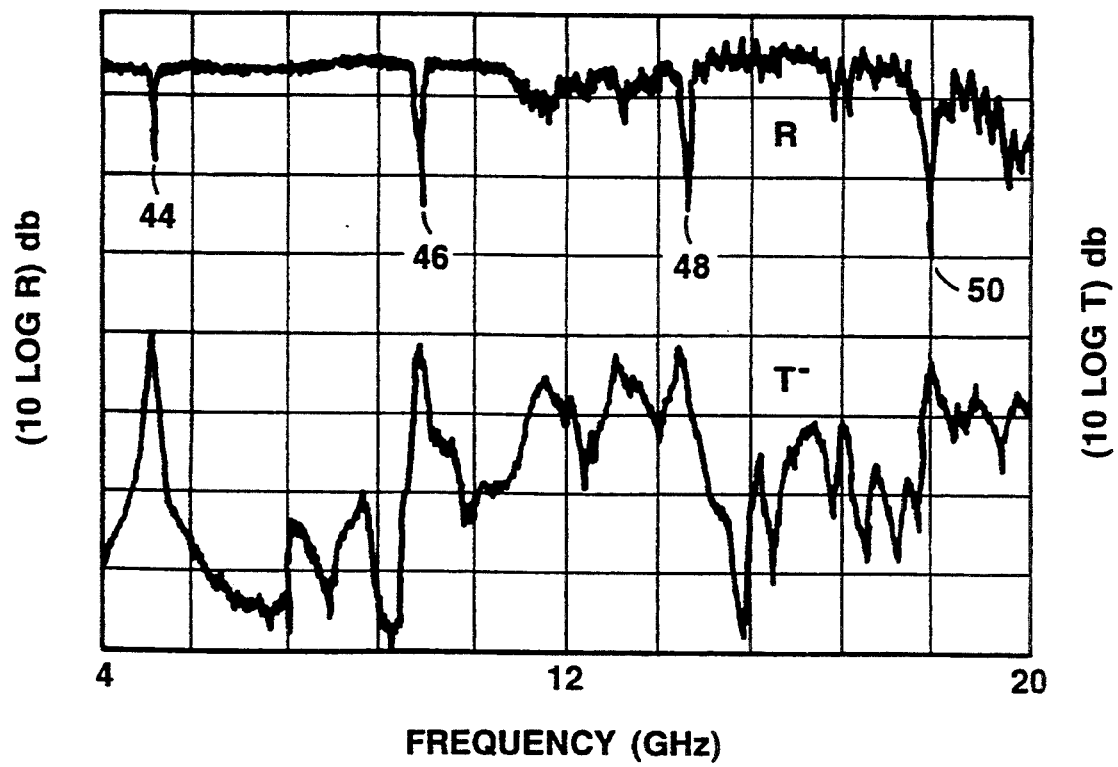
FIG. 6 is a plot of the magnitudes of reflected and transmitted microwave signals versus frequency illustrating the behavior of the microstrip resonator in close proximity and thereby inductively coupled to the SQUID device.

With reference to FIG. 6, measurements of R and T are plotted as a function of frequency for a thin film planar SQUID disposed in the vicinity of a microstrip resonator, as shown in FIG. 1. This non-linear system was held at a temperature of 5° K. using a conventional gas flow system, such as the OXFORD INSTRUMENTS cryostat model CF1204 and temperature controller model ITC4. This particular SQUID/resonator system resonated at the approximate frequencies of 4.84, 9.52, 14.12, and 18.36 GHz as indicated by the peaks 44, 46, 48, 50, respectively.

Figure 7:
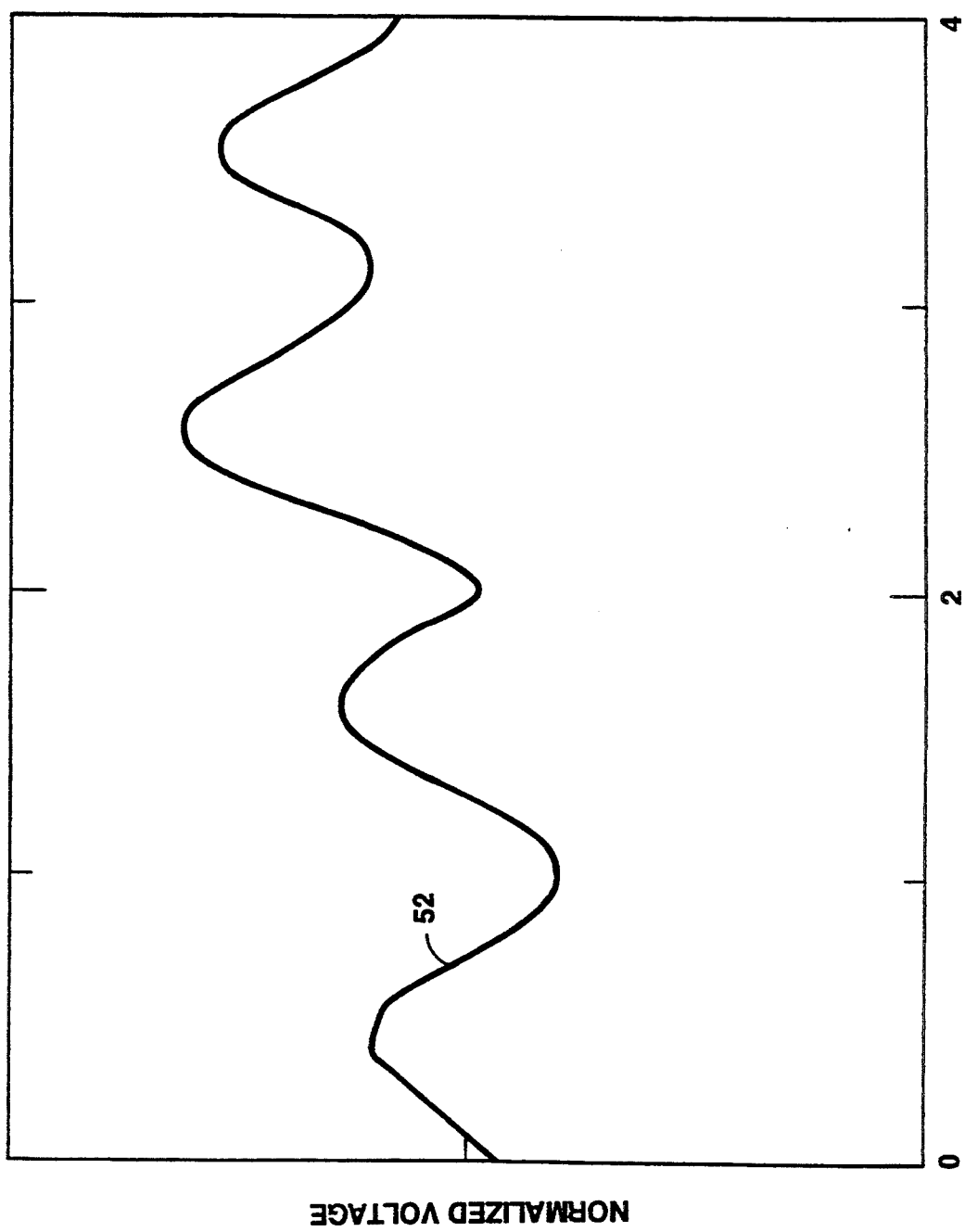
FIG. 7 is a plot of the normalized output voltage of the lock-in amplifier connected to the resonator/SQUID system versus applied DC magnetic flux using a 14.17 GHz resonance peak that illustrates a substantially periodic variation in the normalized output voltage.
Figure 8:
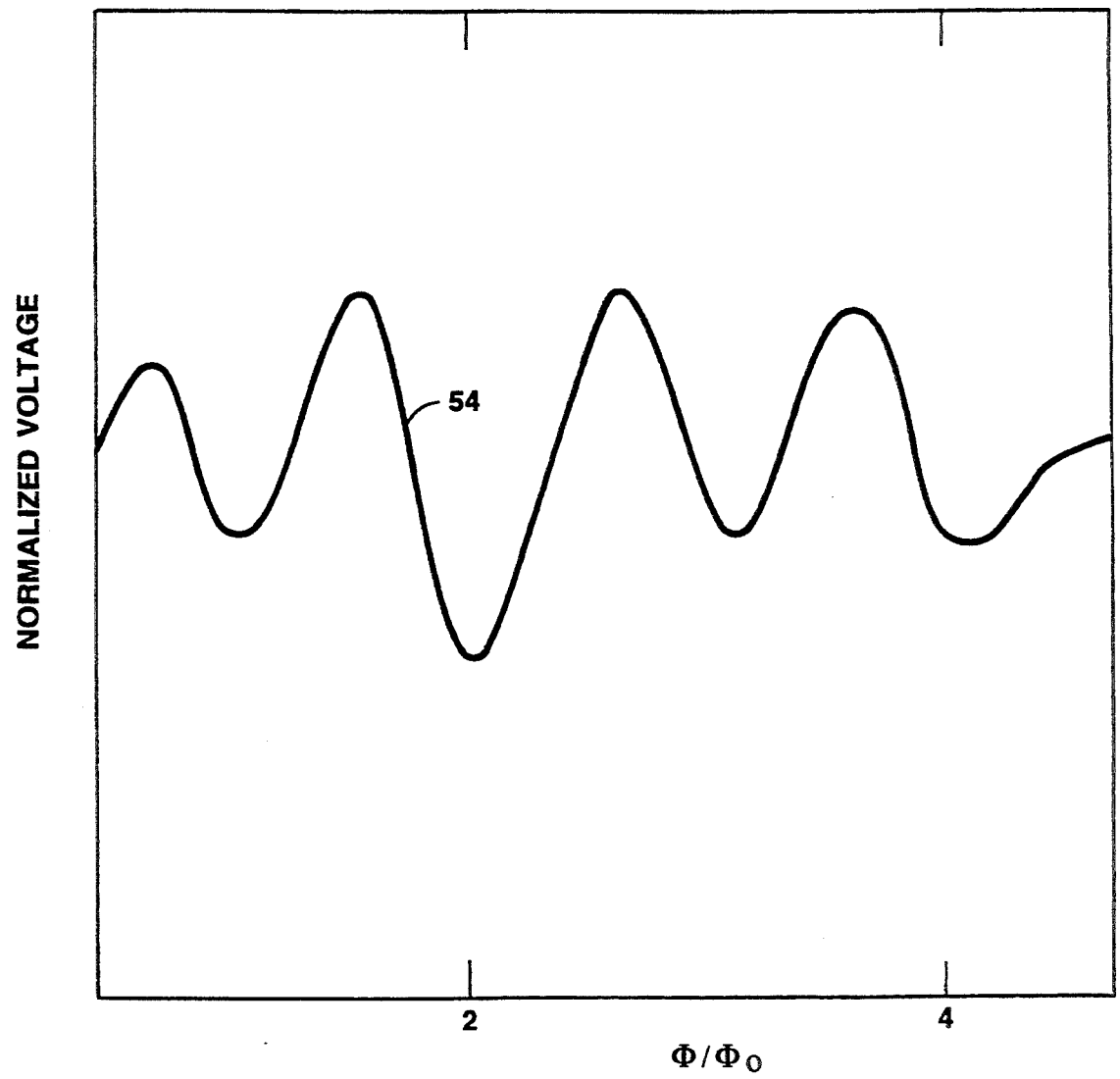
FIG. 8 is a plot of the normalized output voltage of the lock-in amplifier connected to the resonator/SQUID system versus applied DC magnetic flux using a 9.57 GHz resonance peak that illustrates a substantially periodic variation in the normalized output voltage.

In this particular example, the 9.57 and 14.17 GHz resonant modes of the resonator/SQUID system provide the greatest non-linearity and the least noise, and were therefore used to measure variation in R as a function of applied DC magnetic flux. The optimum input power of $10^{-9}$ watts was used. The variation in R employing the 14.17 GHz resonance peak 48 is shown in FIG. 7. The variation of the voltage output of the lock-in amplifier was about 1 mV over a one flux quantum $\phi_0$ variation of applied magnetic flux. The curve 52 exhibited a generally periodic variation with external magnetic flux. The curve 52 represents 600 data points in one DC flux scan, after being smoothed, i.e., removing a noise signal of approximately $0.2\phi/Hz^{\frac{1}{2}}$. Referring to FIG. 8, the voltage of the lock-in amplifier 36 was plotted as a function of applied DC magnetic flux for the 9.57 GHz resonance peak 46 of FIG. 6. The curve 54 is also generally periodic, and displayed a noise level of approximately $0.05\phi_0/Hz^{\frac{1}{2}}$.

In a preferred embodiment, the microstrip resonator 10 and the SQUID device 12 are fabricated photolithographically on a single substrate 11. The SQUID device 12 consists of a thin-film high-$T_c$ superconductor with a precise weak-link microbridge 24 with a length on the order of 1 micron or less. Inductive coupling between the SQUID and the microstrip resonator was achieved by fabricating the SQUID in proximity to the resonator, so as to achieve a coupling strength $K^2 = M^2/\Lambda L$ of approximately 0.2, where M is the mutual inductance between the SQUID and the microstrip resonator, $\Lambda$ is the geometric inductance of the SQUID, and L is the inductance of the microstrip resonator. In a preferred embodiment, the center-to-center separation distance between the microbridge of the SQUID device and the microstrip resonator is approximately 0.5 mm.

The thin film planar SQUID is preferably made from a yttrium barium copper oxide (YBCO) film. The YBCO film is grown on a substrate of yttria stabilized zirconia (YSZ(100)) by ion beam sputtering with a single YBCO target. The YBCO film could also be grown on a substrate of MgO, Si, $SrTiO_3$, or $LaAlO_3$. The target should consist of well-mixed amounts of CuO, $Y_2O_3$ and $BaCO_3$ powders (with 99.9% purity) The target is first heated to 950° C. and is then slow cooled at a rate of 60° C./hr. The sputtering rate should be approximately 2.8 Å/sec. All of the as-deposited films are insulators, and have a smooth surface before post annealing. The films are then thermally annealed in a furnace tube at an oxygen flow rate of 1.2 liters/min. The annealing temperature is then increased linearly (360° C./hr) from room temperature to 700° C., held at that temperature for about 40 minutes, and then increased to 870° C. in 1 hour, held at 870° C. for 1 hour, and then slowly cooled to room temperature in 15 hours. The resistances R(T) of the final films are then measured with a standard four point probe technique using indium contacts. Only films which exhibit sharp superconducting transitions should be used to construct the SQUIDs. For example, a superconducting transition measured at a critical temperature of $T_c = 92K$ to within $\Delta T \approx 3°$ K. provided good results. Either wet or dry etching techniques can be used for fabricating the microbridge weak link, although dry etch techniques provide a device with lower noise.

In, dry etching (ion beam milling), a two-level PMMA-coplanar system (polymethylmethacrylate) was used for the ion beam milling because of the surface roughness of the YBCO films. The procedure was as follows: spin coat P(MMA-MAA) copolymer; perform air convection for 30 minutes at 160° C. spin coat with 9% PMMA; perform air convection for 30 minutes at 160° C.; image resist by vacuum contact, using an exposure wavelength of about 230 nm; develop PMMA using Methyl Isobutyl Ketone and Isopropanol; develop P(MMA-MAA) using Ethoxyethyl Acetate and Ethanol; and then ion mill for 30 minutes at 1000 volts with a 0.5 milliamp beam current and oxygen ash remaining resist.

A wet etching, i.e., photolithographic, technique is used to pattern two holes with a 20 micron gap and a 10 micron wide bridge strip. The procedure for microbridge is then as follows: spin coat photoresist; perform air convection for 15 minutes at 95° C.; expose to UV radiation for 25 minutes; immerse in 516 developer for 4 minutes; perform air convection for 15 minutes at 105° C.; etch in a solution of $H_3PO_4$ and methol; and then wash in acetone. The resulting weak link microbridge of approximately 1 micron in width is then patterned on the 10 micron wide bridge strip.

Other modifications and implementations will occur to those skilled in the art without departing from the spirit and the scope of the invention as claimed. Accordingly, the above description is not intended to limit the invention except as indicated in the following claims.

What is claimed is:

1. A planar SQUID magnetometer comprising:
   a substrate having first and second opposing surfaces;
   a high-$T_c$ superconducting, thin-film SQUID device formed on the first surface of said substrate, said SQUID device including a Josephson device; and
   a planar microwave-resonant element disposed over the first surface of said substrate in overlapping relationship with said Josephson device, and in inductive coupling relationship with said SQUID device.

2. The planar SQUID magnetometer of claim 1 wherein said Josephson device is a microbridge weak link structure.

3. The planar SQUID magnetometer of claim 1 wherein said microwave-resonant element is a microstrip resonator operative to resonate in response to microwave radiation.

4. The planar SQUID magnetometer of claim 1 wherein said planar microwave-resonant element is formed on the same substrate as said thin-film SQUID device.

5. The planar SQUID magnetometer of claim 1 wherein said microwave resonant element is characterized by a Q value that enables said microwave resonant element to couple to signals with frequencies greater than 430 MHz, including high frequency microwave signals that exceed 50 GHz.

6. The planar SQUID magnetometer of claim 1 wherein said microwave resonant element is disposed in close proximity to said Josephson device so as to expose said Josephson device to maximum magnetic field strength and thereby maximize coupling by magnetic field induction.

7. The planar SQUID magnetometer of claim 6 wherein the center-to-center separation distance between the Josephson device of the SQUID device and the resonant element is substantially 0.5 mm.

8. The planar SQUID magnetometer of claim 1 wherein said substrate is made of a material selected from the group consisting of cubic zirconia, MgO, Si, $SrTiO_3$ and $LaAlO_3$.

9. The planar SQUID magnetometer of claim 1 wherein said microwave resonant element is made of a superconducting material.

10. The planar SQUID magnetometer of claim 1 wherein said thin film planar SQUID is made from a film of a high-$T_c$ superconducting material.

11. The planar SQUID magnetometer of claim 10 wherein the high-$T_c$ superconducting material is YBCO.

12. The planar SQUID magnetometer of claim 1 wherein said high-$T_c$ superconducting, thin-film SQUID device is a two-hole balanced SQUID device.

13. The planar SQUID magnetometer of claim 12 wherein said microstrip resonator overlies a bridge region of said two-hole SQUID device and is disposed between two holes of said two-hole SQUID device.

14. The planar SQUID magnetometer of claim 1 wherein said high-$T_c$ superconducting, thin-film SQUID device is a single-hole unbalanced SQUID device.

15. A planar SQUID magnetometer comprising:
    a substrate having first and second opposing surfaces;
    a high-$T_c$ superconducting, thin-film SQUID device formed on the first surface of said substrate, said SQUID device including a microbridge weak link; and
    a microstrip resonator in overlapping relationship with said microbridge weak link and in inductive coupling relationship with said SQUID device.

16. The planar SQUID magnetometer of claim 15 wherein said microstrip resonator is deposited on the same substrate as said thin-film SQUID device.

17. The planar SQUID magnetometer of claim 15 wherein said microstrip resonator is characterized by a Q value that enables said microstrip resonator to couple to signals with frequencies greater than 430 MHz, including high frequency microwave signals that exceed 50 GHz.

18. The planar SQUID magnetometer of claim 15 wherein said microstrip resonator is disposed in close proximity to said microbridge weak link so as to expose said weak link to maximum magnetic field strength and thereby maximize coupling by magnetic field induction.

19. The planar SQUID magnetometer of claim 18 wherein the center-to-center separation distance between the weak link of the SQUID device and the microstrip resonator is substantially 0.5 mm.

20. The planar SQUID magnetometer of claim 15 wherein said high-$T_c$ superconducting, thin-film SQUID device is a single-hole unbalanced SQUID device.

21. The planar SQUID magnetometer of claim 15 wherein said high-$T_c$ superconducting, thin-film SQUID device is a two-hole balanced SQUID device.

22. The planar SQUID magnetometer of claim 21 wherein said microstrip resonator overlies a bridge region of said two-hole SQUID device and is disposed between two holes of said two-hole SQUID device.

* * * * *